United States Patent [19]
Bhat et al.

[11] Patent Number: 5,323,416
[45] Date of Patent: Jun. 21, 1994

[54] PLANARIZED INTERFERENCE MIRROR

[75] Inventors: Rajaram Bhat, Middletown; Sung-Joo Yoo, Shrewsbury, both of N.J.

[73] Assignee: Bell Communications Research, Inc., Livingston, N.J.

[21] Appl. No.: 109,771

[22] Filed: Aug. 20, 1993

[51] Int. Cl.$^5$ ............................ H01S 3/08; H01S 3/18
[52] U.S. Cl. ............................................ 372/99; 372/45
[58] Field of Search ........................ 372/99, 50, 45, 96

[56] References Cited

U.S. PATENT DOCUMENTS

| | | | |
|---|---|---|---|
| 4,856,019 | 8/1989 | Miyata et al. | 372/99 |
| 4,949,350 | 8/1990 | Jewell et al. | 372/45 |
| 5,034,958 | 7/1991 | Kwon et al. | 372/45 |
| 5,104,824 | 4/1992 | Clausen, Jr. et al. | 437/90 |
| 5,115,441 | 5/1992 | Kopf et al. | 372/99 |
| 5,244,749 | 9/1993 | Bean et al. | 372/45 |

OTHER PUBLICATIONS

F. S. Choa et al., "High reflectivity 1.55 μm InP/InGaAsP Bragg mirror grown by chemical beam epitaxy," *Applied Physics Letters*, Nov. 25, 1991, vol. 59, pp. 2820–2822.

T. Tadokoro et al., "Room Temperature Pulsed Operation of 1.5 μm GaInAsP/InP Vertical-Cavity Surface-Emitting Laser," *IEEE Photonics Technology Letters*, May 1992, vol. 5, pp. 409–411.

K. Tai et al., "Room temperature photopumped 1.5 μm quantum well surface emitting lasers with InGaAsP/InP distributed Bragg reflectors," *Electronics Letters*, Aug. 15, 1991, vol. 27, pp. 1540–1542.

S. J. B. Yoo et al., "Quasi-CW Room-Temperature Operation of 1.55 μm Vertical Cavity Surface Emitting Lasers Grown by OMCVD," *IEEE Lasers & Electro-Optics Society 1992 Annual Meeting: Post Deadline Papers*, Paper PD6, Nov. 16, 1992.

*Primary Examiner*—Rodney B. Bovernick
*Assistant Examiner*—Robert McNutt
*Attorney, Agent, or Firm*—Leonard Charles Suchyta; James W. Falk

[57] ABSTRACT

A semiconductor interference mirror principally comprising a large number of pairs (36) of semiconductor layers (38,40) having different dielectric constants and having optical thicknesses equal to one-quarter of the wavelength of light to be reflected. For example, the two semiconductors are InP and InGaAsP for reflecting 1.55-μm light. However, every 10 to 15 periods in the mirror, the InP layer (44) is grown more slowly to a thickness that is an odd multiple of its usual quarter-wavelength thickness. Because indium is so mobile and binary composition is well defined, the binary InP layer replanarizes the growth, thus assuring a planar mirror. The faster growth rate for the majority of the mirror allows the mirror to be grown in a shorter time, thus reducing process variations.

9 Claims, 3 Drawing Sheets

PLANARIZED INTERFERENCE MIRROR

FIELD OF THE INVENTION

The invention relates generally to optical interference mirrors. In particular, the invention relates to semiconductor interference mirrors.

BACKGROUND ART

Optical interference mirrors, also referred to as etalons, are well known. In their usual configuration, they consist of a stack of alternating layers of two dielectric materials with differing dielectric constants, i.e., the refractive index differs between the two materials. The dielectric mismatch at the interfaces causes a fraction of the light traversing the stack, usually at a perpendicular angle, to be reflected at each of the successive interfaces. For an interference mirrors, the optical thickness of each of the layers is chosen to be one-quarter of the wavelength of the light to be reflected. The optical thickness equals the product of the physical thickness and the real part of the dielectric constant. Because of the quarter-wavelength thicknesses, the etalon is resonant and the reflected components have coherent phase. A careful study of the mathematics will show that if the resonant conditions are satisfied, no light is transmitted, and, assuming no absorption due to an imaginary part of the dielectric constant, the resonant light is totally reflected.

Of course, the resonant condition is exactly satisfied only for a single wavelength, but in practice the reflective bandwidth is broad enough to reflect a narrow but significant band of wavelength. The remainder of the optical spectrum is incompletely reflected if it is reflected at all.

The reflection at the interface is maximized by a large dielectric mismatch, and absorption is minimized (and hence total reflectivity is maximized) by a purely dielectric material. Therefore, the standard interference mirror consists of a few layers of two dielectrics, such as silica and semi-insulating silicon for the infrared optical band. These materials have real dielectric constants of 3.9 and 11.9 and very small imaginary parts of the dielectric constant.

Nonetheless, recent advances in surface-emitting semiconductor diode lasers have demonstrated the importance of semiconductor interference mirrors. Jewell et al. in U.S. Pat. No. 4,949,350 have disclosed a practical vertical-cavity, surface-emitting semiconductor diode laser including, as illustrated in the cross section of FIG. 1, a pillar 10 epitaxially grown upon a singly crystalline substrate 12. Laterally undefined layers are first grown and later laterally defined into the pillar 10.

The laser pillar 10 includes three major parts: a lower n-type semiconductor interference mirror 14; a resonant cavity region 16; and an upper p-type semiconductor interference mirror 18. All parts are III-V semiconductors of the GaAs/AlAs family, with the active quantum wells being of GaInAs. The resonant cavity region 16 has an optical length equal to the desired free-space wavelength, or to half the wavelength dependent upon the phase matching conditions of the mirrors 14 and 18, or to integral multiples thereof. The resonant cavity region 16 includes on its lower half an n-type region and on its upper half a p-type region, between which is located an active layer 20 having one or more quantum-well layers. Two electrical leads 22 and 24 are attached to the substrate 12 and to a metallization layer 26 so that the active layer 20 can be forward biased so as to emit light. The light is predominantly reflected by the mirrors 14 and 18 and by the metallization 26 so that it lases, and a portion of the lasing light is emitted through the bottom of the substrate 12.

In order to obtain a high-quality active region 20, Jewell et al. grew it epitaxially upon the singly crystalline substrate 12. That is, at least the lower interference mirror 14 is a III-V semiconductor structure epitaxially grown on the substrate 12. However, semiconductor interference mirrors have the disadvantage that the difference in refractive index between the layers is relatively small. Therefore, a large number of stacked layers need to be grown in order to provide the required reflectivity of better than 98%. The surface-emitter diode laser of Jewell et al. had 20 pairs of alternating layers in each of its interference layers and was more than 5 $\mu$m high. It requires ten hours to grow by molecular beam epitaxy.

The surface-emitting diode laser of Jewell et al. was based on the GaAs/AlAs material family and hence emitted in the optical band around 0.96 $\mu$m. That material family is limited to the 0.77 to 1.0 $\mu$m band. On the other hand, the telecommunication industry has a great need for low-power lasers in the 1.3 to 1.55 $\mu$m band. The longer wavelength requires a different material family, for example, InP/InGaAsP. However, as discussed by Choa et al. in "High reflectivity 1.55 $\mu$m InP/InGaAsP Bragg mirror grown by chemical beam epitaxy," *Applied Physics Letters*, vol. 59, 1991, pp. 2820-2822, the index difference between the two materials in the interference mirrors is relatively small, and more than forty pairs of alternating layers are required to achieve a reflectivity of 99%. Furthermore, the longer wavelength necessitates thicker quarter-wavelength layers. The resulting single interference mirror has a thickness of 11.5 $\mu$m. Such thicknesses are difficult to achieve for epitaxial growth, especially for the quaternary InGaAsP which needs to be lattice matched to InP. Particularly the quaternary layers tend to grow unevenly and the hillocks propagate from layer to layer, producing non-planar mirror layers. Also, a lack of precise compositional control produces quaternary layers that are not precisely lattice matched to the binary layer and substrate. As a result, stress accumulates over the very thick interference mirrors to the point that dislocations occur, thus degrading the electrical and optical performance.

Until now, the longer wavelength surface emitting lasers have not been able to continuously lase at room temperature, presumably because of the poor reflectivity of the mirrors. For example, Tadokoro et al. disclose a diode laser in "Room Temperature Pulsed Operation of 1.5 $\mu$m GaInAsP/InP Vertical-Cavity Surface-Emitting Laser," *IEEE Photonics Technology Letters*, vol. 5, 1992, pp. 409-411. Their laser has mirrors with 34 pairs of InP and GaInAsP, resulting in a reflectivity of 97%. Only pulsed lasing at room temperature is reported and the threshold current is relatively large. However, the mirror of Choa et al. has been used in a pulsed photo-pumped laser. As reported by Tai et al. in "Room temperature photopumped 1.5 $\mu$m quantum well surface emitting lasers with InGaAsP/InP distributed Bragg reflectors," *Electronics Letters*, vol. 27, 1991, pp. 1540-1542, a 1:4000 duty cycle was required because of heating, and the optical pumping lasing threshold was 100 kW/cm$^2$.

SUMMARY OF THE INVENTION

Accordingly, an object of the invention is to provide a highly planar interference mirror.

The invention may be summarized as an interference mirror comprising occasional layers having thicknesses that are an odd multiple of a quarter-wavelength of the light to be reflected. The mirrors are advantageously grown at a lower growth rate for the thicker layers than for the thinner layers.

DESCRIPTION OF THE PREFERRED EMBODIMENTS

We have found that a highly planar interference mirror can be grown if occasional layers of it are thicker than the usual quarter-wavelength thickness. In order to maintain the required phase matching, the thicker layers should have a optical thickness that is an odd multiple of a quarter of the wavelength of light to be reflected while most of the layers have an optical thickness of a quarter wavelength.

Figure 1:
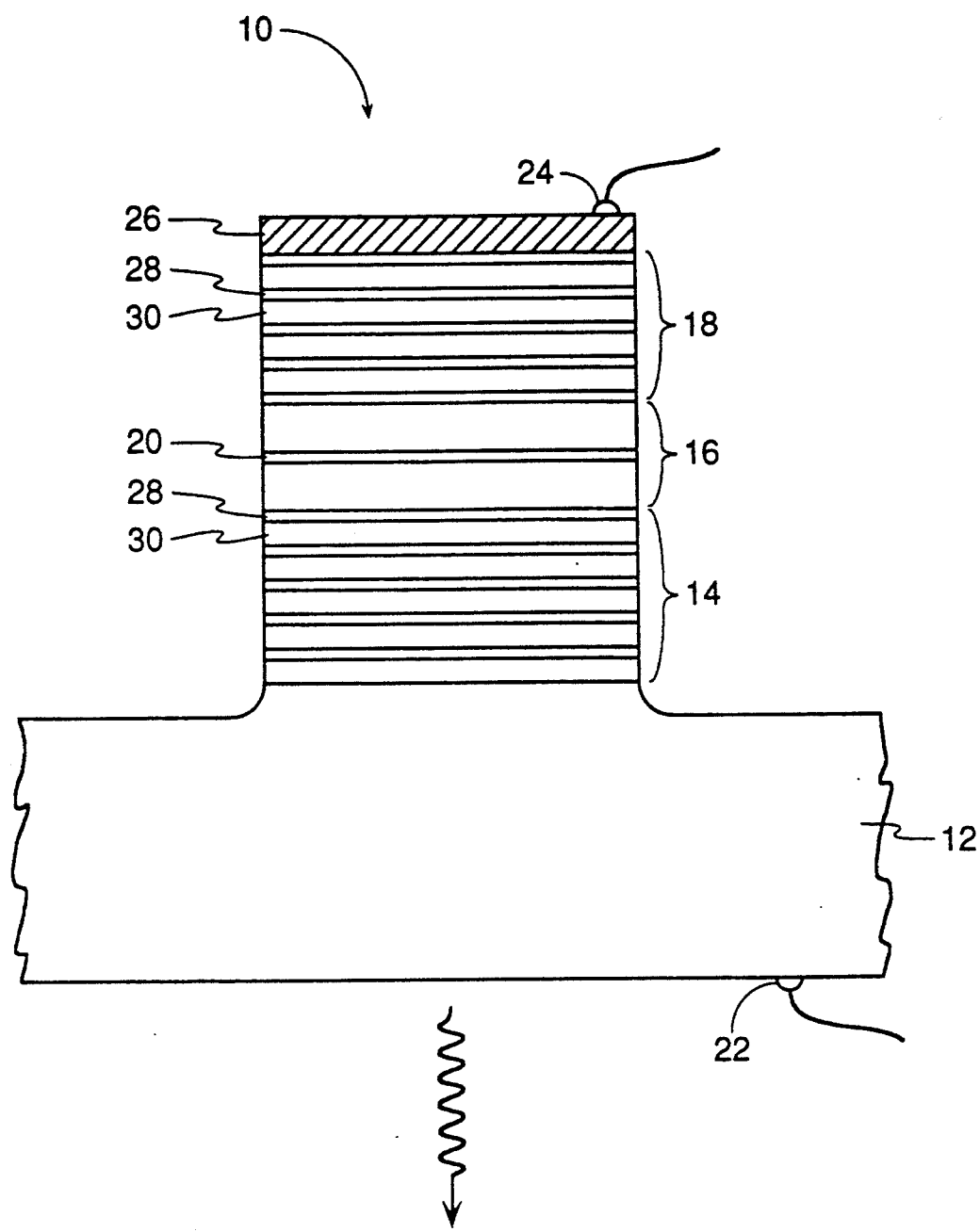
FIG. 1 is a cross-sectional view of a vertical-cavity, surface emitting laser.
Figure 2:
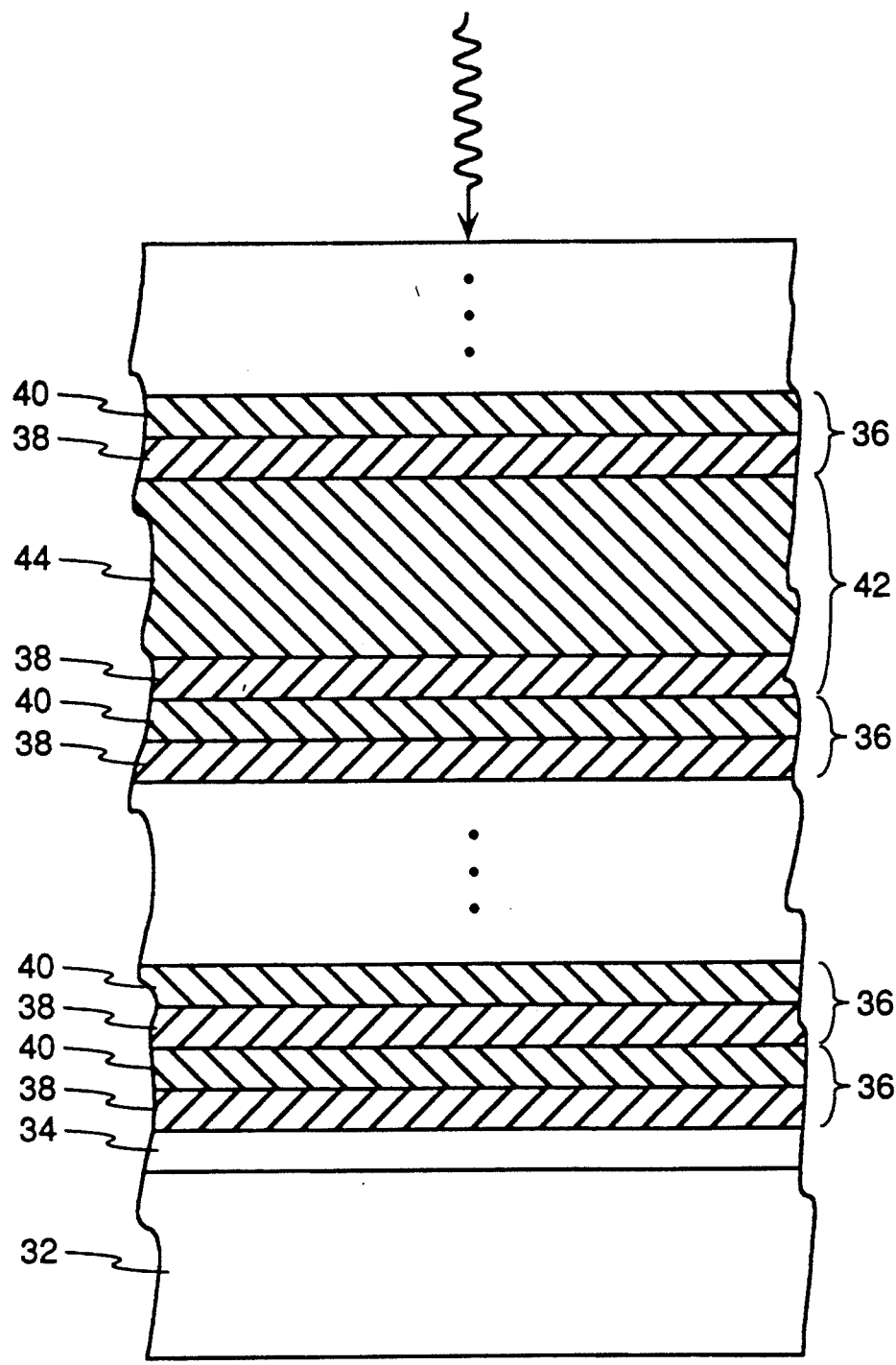
FIG. 2 is a cross-sectional view of a semiconductor interference mirror according to the invention.

A long-wavelength semiconductor interference mirror designed to reflect at 1.55 $\mu$m is illustrated in cross section in FIG. 2. It is epitaxially grown on an n$^+$-type singly crystalline substrate 32 of InP with a buffer layer 34 of n$^+$-type InP epitaxially grown over it to a thickness of 200 nm. The mirror portion predominantly consists of pairs 36 of quarter-wavelength n-type InGaAsP layers 38 and InP layers 40. The InGaAsP layers 38 have a composition exhibiting an electronic bandgap, as measured by photoluminescence, of 1.44 $\mu$m and a physical thickness of 108.6 nm, corresponding to a quarter wavelength in free space of 1.55 $\mu$m. The InP layers 40 have a thickness of 118.8 nm similarly corresponding to a quarter wavelength of 1.55 $\mu$m. Nine pairs 36 of alternating InGaAsP and InP layers 38 and 40 are grown in the usual manner.

However, according to the invention, thereafter there is grown a planarizing pair 42 including the usual quarter-wavelength InGaAsP layer 38 and a planarizing InP layer 44 of the same n-type InP composition but having an optical thickness of 5/4 of the wavelength to be reflected, specifically 594 nm. Thereafter, another sequence of the quarter-wavelength pairs 36 are grown, and they are planarized by the thicker InP layer 44.

Several factors are believed to contribute to the planarizing effect of the thicker InP layer 44. Stoichiometry is more easily maintained with the diatomic InP composition. Even if InGaAsP is stoichiometric, it is difficult to precisely maintain its composition to be lattice matched to InP. Thick layers of material that is not lattice matched will introduce strain and eventually result in dislocations. Also, In has a higher surface mobility than Ga so that InP naturally planarizes.

An optically pumped laser was fabricated incorporating the non-periodic interference mirror of the invention. The layers were grown using organo-metallic chemical vapor deposition (OMCVD). The reagents were trimethygallium, trimethylindium, arsine, and phosphine, and the carrier gas was hydrogen producing a total pressure within the reactor of 76 torr. Growth rates were controlled by varying the partial pressure of the reagent gasses while maintaining the same total pressure. The growth temperature was 625° C. A total of 40 to 45 layer pairs were deposited for the lower mirror. According to the invention, approximately every tenth InP layer had an optical thickness of 5$\lambda$/4 rather than $\lambda$/4, where $\lambda$ is the design free-space wavelength for laser emission. A thicker InP layer alternating with between 10 and 15 thinner InP layers provides the required planarization without unduly increasing the height of the stack. The thicker InP layer could have an optical thickness that is any odd multiple of $\lambda$/4, with 3$\lambda$/4 being the minimum, that is, (2n+1)$\lambda$/4, with n being a positive integer.

The main portions of the mirrors were grown at a high growth rate of 4.5 to 9 $\mu$m/hr, which is three to four times the conventional rate. The quickly grown InP and InGaAsP layers were, in fact, grown at different growth rates due to limitations of the growth reactor. If the reactor were not so limited, it would be desirable to grow both the thinner InP layers and the InGaAsP layers at the same fast rate. However, the thicker InP layers were grown at the lower conventional rate. The higher growth rate increases the quality of the mirror because the growth parameters are not so likely to wander during the resulting shorter growth period. Furthermore, the higher growth rate allowed the 10-$\mu$m mirror stack to be grown in a more reasonable 2½ hours.

Figure 3:
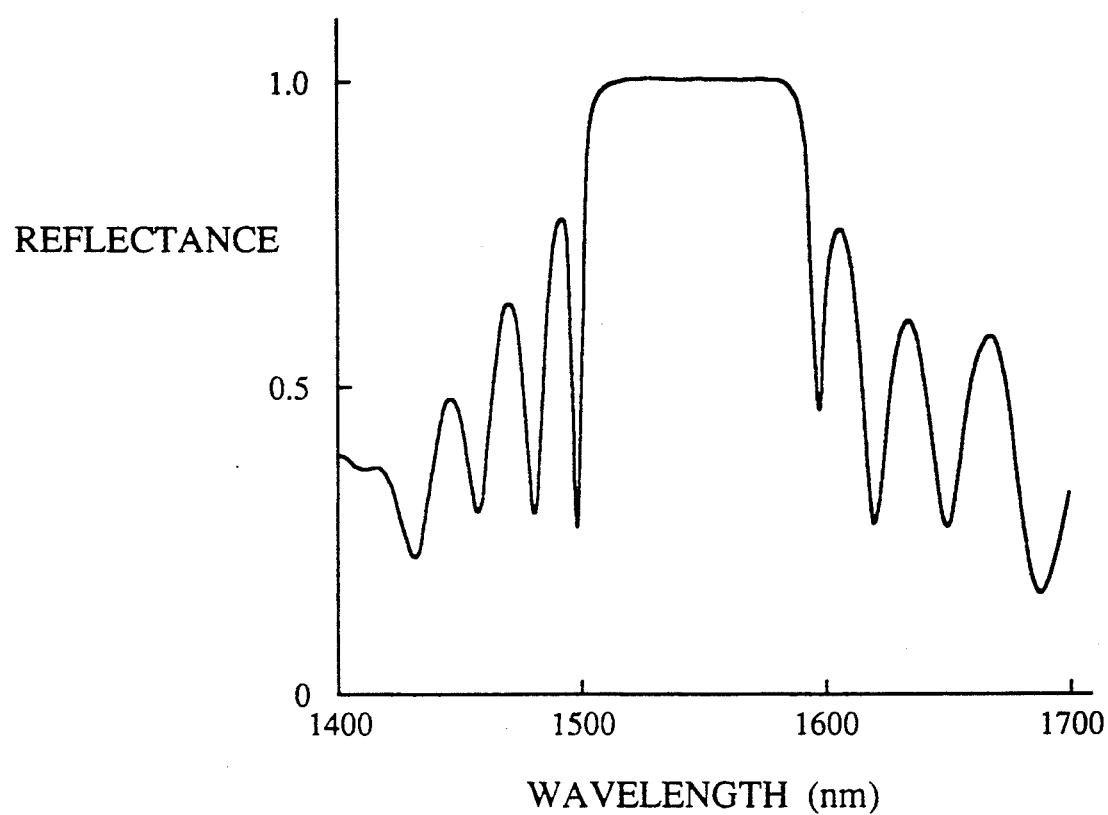
FIG. 3 is a reflectance spectrum measured for the interference mirror of FIG. 2.

Double-crystal x-ray rocking curves show very sharp satellite peaks for the quickly grown mirror stacks but much broader peaks for the more slowly grown stacks. The peak sharpness indicates the planarity of the interference layers. The reflectance of the interference mirror of the invention is shown in FIG. 3. A broad flat peak around 1.55 $\mu$m had a measured reflectance of 99.1%, ±1%. However, other reflectance spectra measured at different portions of the same wafer showed the peak shifting over a range of about 50 nm due to growth rate variations across the 2-inch (50 mm) wafer.

A vertical-cavity laser having 12 quantum wells was then formed on the lower mirror of FIG. 2 following the structural fabrication described by Yoo et al. in "Quasi-CW Room-Temperature Operation of 1.55 $\mu$m Vertical Cavity Surface Emitting Lasers Grown by OMCVD," *IEEE Lasers & Electro-Optics Society* 1992 *Annual Meeting: Post Deadline Papers*, Paper PD6, 1992. Because of the optical pumping, it was possible to use a dielectric upper mirror. With optical pumping, as reported in that article, the structure lased quasi-CW (duty cycle up to 1:20) at room temperature at a wavelength of 1.55 $\mu$m with a lasing pumping threshold equivalent to 20 mA for a 10-$\mu$m diameter device, i.e., 28 kA/cm$^2$.

The invention can be used with other types of surface-emitting lasers, such as those described by Kwon et al. in U.S. Pat. No. 5,034,958 and by Clausen, Jr. et al. in U.S. Pat. No. 5,104,824. Furthermore, although simple, homogeneous interference layers are described above, it is understood that such layers include dopant species and may include interfacial superlattices to assist electronic transport, as have been described by Jewell et al.

Although the invention has been described with reference to long-wavelength semiconductor mirrors of InP/InGaAsP, it can be applied to other types of interference mirrors, including dielectric interference mirrors. However, the invention is particularly useful for epitaxial semiconductor mirrors for which it is difficult to maintain compositional control in the quaternary layer but easy in the binary layer. The principle of the invention is applicable to other semiconductor systems and to other growth apparatus than those described in the example.

The invention thus provides interference mirrors of greatly improved planarity and reflectance with only a minimal increase in complexity. Furthermore, the dual-speed growth allows the deposition of high quality mirrors in less time than required for lower quality mirrors of the prior art.

What is claimed is:

1. An interference mirror comprising alternating first layers comprising a first dielectric constant and second layers comprising a second dielectric constant, a majority of said layers having a first optical thickness related to a wavelength of light to be reflected, at least one of said layers intermediate in said mirror having a second optical thickness that is an odd multiple of said first optical thickness and wherein said first optical thickness substantially equals one-quarter of said wavelength.

2. An interference mirror as recited in claim 1, further comprising a semiconductor substrate on which said layers are epitaxially formed.

3. An interference mirror as recited in claim 1, wherein said first layers comprise a binary semiconductor and said second layers comprise a quaternary semiconductor and wherein said at least one intermediate layer comprises said binary semiconductor.

4. A semiconductor interference mirror, comprising:
a substrate; and
a plurality of pairs of first and second layers epitaxially formed on said substrate, said first layers comprising a first semiconductive composition and having a first optical thickness, said second layers comprising a second semiconductive composition, some of said second layers having said first optical thickness, at least one of said second layers having a second optical thickness that is an odd multiple of said first optical thickness.

5. A semiconductive interference mirror as recited in claim 4, wherein said odd multiple is three.

6. A semiconductive interference mirror as recited in claim 4, wherein said odd multiple is five.

7. A semiconductive interference mirror as recited in claim 4, wherein said first composition is a quaternary composition and said second composition is a binary composition.

8. A semiconductive interference mirror as recited in claim 7, wherein said quaternary composition is InGaAsP and said binary composition is InP.

9. A semiconductive interference mirror as recited in claim 4, wherein said second layers are arranged with between 10 and 15 of them having said first optical thickness and then one of them having said second optical thickness and then between 10 and 15 of them having said first optical thickness.

* * * * *